(12) United States Patent
Leung et al.

(10) Patent No.: US 6,171,687 B1
(45) Date of Patent: Jan. 9, 2001

(54) INFILTRATED NANOPOROUS MATERIALS AND METHODS OF PRODUCING SAME

(75) Inventors: Roger Leung; David Schaefer, both of San Jose; John Sikonia, Morgan Hill, all of CA (US)

(73) Assignee: Honeywell International Inc., Morristown, NJ (US)

( * ) Notice: Under 35 U.S.C. 154(b), the term of this patent shall be extended for 0 days.

(21) Appl. No.: 09/420,042

(22) Filed: Oct. 18, 1999

(51) Int. Cl.[7] .................................................... B32B 3/26
(52) U.S. Cl. .................................. 428/304.4; 428/306.6; 428/308.4; 428/315.5; 428/315.9; 428/320.2; 428/322.7; 428/327
(58) Field of Search .................... 428/304.4, 306.6, 428/308.4, 315.5, 315.9, 320.2, 322.7, 327

(56) References Cited

U.S. PATENT DOCUMENTS

| | | | |
|---|---|---|---|
| 4,230,463 | * 10/1980 | Henis et al. | 427/245 |
| 4,919,992 | * 4/1990 | Blundell et al. | 428/131 |
| 5,458,709 | 10/1995 | Kamezaki et al. | 156/89 |
| 5,473,118 | * 12/1995 | Fukutake et al. | 174/258 |
| 5,593,526 | 1/1997 | Yokouchi et al. | 156/89 |
| 5,710,187 | * 1/1998 | Steckle, Jr. et al. | 521/64 |
| 5,776,990 | 7/1998 | Hedrick et al. | 521/77 |
| 5,872,070 | * 2/1999 | Dismukes et al. | 501/87 |
| 5,874,516 | 2/1999 | Burgoyne, Jr. et al. | 528/219 |

* cited by examiner

Primary Examiner—Cathy F. Lam
(74) Attorney, Agent, or Firm—Fish & Associates, LLP; Robert D. Fish

(57) ABSTRACT

In accordance with the present invention, a low dielectric constant structural layer is produced having increased mechanical strength and having a plurality of voids that comprises a substrate layer; a low dielectric structural layer juxtaposing the substrate layer; and an infiltrating layer comprising an infiltrating material having a volatile component and a reinforcing component juxtaposing the structural layer and coating at least some of the plurality of voids. Also, methods are provided in which the mechanical strength of a structural layer having a plurality of voids is increased by a) depositing the structural layer on a substrate layer; b) providing an infiltrating material having a volatile component and a reinforcing component; c) introducing the infiltrating material into at least some of the plurality of voids; and d) treating the infiltrating material such that the structural strength is increased by a substantial amount.

10 Claims, 2 Drawing Sheets

INFILTRATED NANOPOROUS MATERIALS AND METHODS OF PRODUCING SAME

FIELD OF THE INVENTION

The field of the invention is nanoporous materials.

BACKGROUND

As the size of functional elements in integrated circuits decreases, complexity and interconnectivity increases. To accommodate the growing demand of interconnections in modern integrated circuits, on-chip interconnections have been developed. Such interconnections generally consist of multiple layers of metallic conductor lines embedded in a low dielectric constant material. The dielectric constant in such material has a very important influence on the performance of an integrated circuit. Materials having low dielectric constants (i.e., below 2.5) are desirable because they allow faster signal velocity and shorter cycle times. In general, low dielectric constant materials reduce capacitive effects in integrated circuits, which frequently leads to less cross talk between conductor lines, and allows for lower voltages to drive integrated circuits.

Low dielectric constant materials can be characterized as predominantly inorganic or organic. Inorganic oxides often have dielectric constants between 2.5 and 4, which tends to become problematic when device features in integrated circuits are smaller than 1 μm. Organic polymers include epoxy networks, cyanate ester resins, polyarylene ethers, and polyimides. Epoxy networks frequently show disadvantageously high dielectric constants at about 3.8–4.5. Cyanate ester resins have relatively low dielectric constants between approximately 2.5–3.7, but tend to be rather brittle, thereby limiting their utility. Polyimides and polyarylene ethers, have shown many advantageous properties including high thermal stability, ease of processing, low stress, low dielectric constant and high resistance, and such polymers are therefore frequently used as alternative low dielectric constant polymers.

With respect to other properties, desirable dielectrics should also be free from moisture and out-gassing problems, have suitable adhesive and gap-filling qualities, and have suitable dimensional stability towards thermal cycling, etching, and CMP processes (i.e., chemical, mechanical, polishing). Preferred dielectrics should also have Tg values (glass transition temperatures) of at least 300° C., and preferably 400° C. or more.

The demand for materials having dielectric constant lower than 2.5 has led to the development of dielectric materials with designed-in nanoporosity. Since air has a dielectric constant of about 1.0, a major goal is to reduce the dielectric constant of nanoporous materials down towards a theoretical limit of 1. Several approaches are known in the art for fabricating nanoporous materials. In one approach, small hollow glass spheres are introduced into a material. Examples are given in U.S. Pat. No. 5,458,709 to Kamezaki and U.S. Pat. No. 5,593,526 to Yokouchi. However, the use of small, hollow glass spheres is typically limited to inorganic silicon-containing polymers.

In another approach, a thermostable polymer is blended with a thermolabile (thermally decomposable) polymer. The blended mixture is then crosslinked and the thermolabile portion thermolyzed. Examples are set forth in U.S. Pat. No. 5,776,990 to Hedrick et al. Alternatively, thermolabile blocks and thermostable blocks alternate in a single block copolymer, or thermostable blocks and thermostable blocks carrying thermolabile portions are mixed and polymerized to yield a copolymer. The copolymer is subsequently heated to thermolyze the thermolabile blocks. Dielectrics with k-values of 2.2, or less have been produced employing thermolabile portions. However, many difficulties are encountered utilizing mixtures of thermostable and thermolabile polymers. For example, in some cases distribution and pore size of the nanovoids is difficult to control. In addition, the temperature difference between thermal decomposition of the thermolabile group and the glass transition temperature (Tg) of the dielectric is relatively low. Still further, an increase in the concentration of thermolabile portions in a dielectric generally results in a decrease in mechanical stability.

In yet another approach, a polymer is formed from a first solution in the presence of microdroplets of a second solution, where the second solution is essentially immiscible with the first solution. During polymerization, rnicrodroplets are entrapped in the forming polymeric matrix. After polymerization, the microdroplets of the second solution are evaporated by heating the polymer to a temperature above the boiling point of the second solution, thereby leaving nanovoids in the polymer. However, generating nanovoids by evaporation of microdroplets suffers from several disadvantages. Evaporation of fluids from polymeric structures tends to be an incomplete process that may lead to undesired out-gassing, and potential retention of moisture. Furthermore, many solvents have a relatively high vapor pressure, and methods using such solvents therefore require additional heating or vacuum treatment to completely remove such solvents. Moreover, employing microdroplets to generate nanovoids often allows little control over pore size and pore distribution.

These problems are addressed in copending applications, Ser. Nos.: 60/128465; 60/128533; 60/128534; 60/128493; and 60/133218. In these applications, it is disclosed that nanoporous materials can be fabricated a) from polymers having backbones with reactive groups used in crosslinking; b) from polymer strands having backbones that are crosslinked using ring structures; and c) from stable, polymeric template strands having reactive groups that can be used for adding thermolabile groups or for crosslinking; d) by depositing cyclic oligomers on a substrate layer of the device, including the cyclic oligomers in a polymer, and crosslinking the polymer to form a crosslinked polymer; and e) by using a dissolvable phase to form a polymer.

Regardless of the approach used to introduce the voids, structural problems are frequently encountered in fabricating and processing nanoporous materials. Among other things, increasing the porosity beyond a critical extent (generally about 30% in the known nanoporous materials) tends to cause the porous materials to be weak and in some cases to collapse. Collapse can be prevented to some degree by adding crosslinking additives that couple thermostable portions with other thermostable portions, thereby producing a more rigid network. However, the porous material, even after cross-linking, can lose mechanical strength as the porosity increases, and the material will be unable to survive during integration of the dielectric film to a circuit.

Therefore, there is a need to provide methods and compositions to produce nanoporous low dielectric materials that combine the maximum allowable porosity with the maximum allowable durability and film strength.

SUMMARY OF THE INVENTION

In accordance with the present invention, a low dielectric constant structural layer is produced having increased mechanical strength and having a plurality of voids that comprises a substrate layer; a low dielectric structural layer juxtaposing the substrate layer; and an infiltrating layer comprising an infiltrating material having a volatile component and a reinforcing component juxtaposing the structural layer and coating at least some of the plurality of voids.

Also, methods are provided in which the mechanical strength of a structural layer having a plurality of voids is increased by a) depositing the structural layer on a substrate layer; b) providing an infiltrating material having a volatile component and a reinforcing component; c) introducing the infiltrating material into at least some of the plurality of voids; and d) treating the infiltrating material such that the structural strength is increased by a substantial amount.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
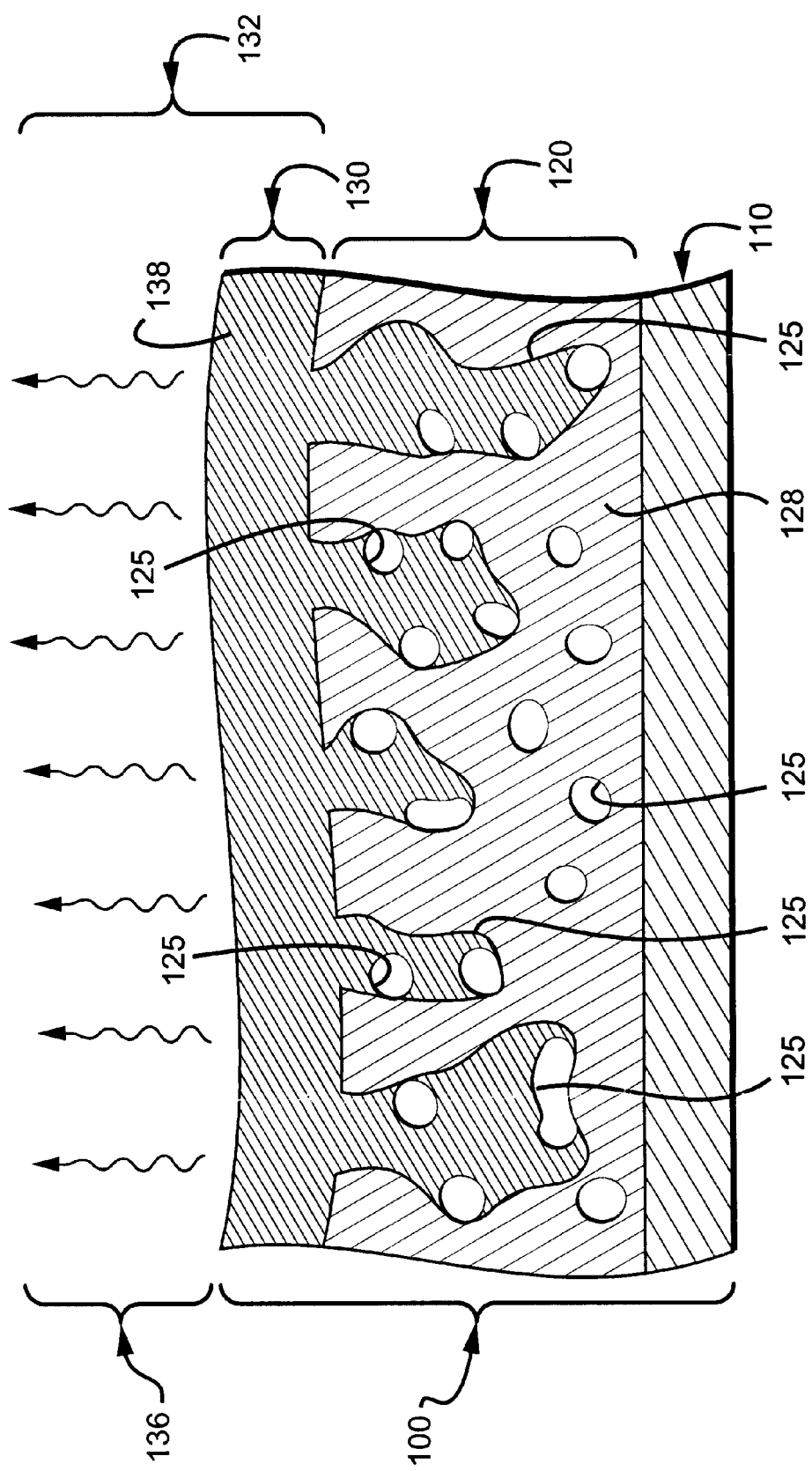
FIG. 1 shows a cross-sectional view of a preferred embodiment.

In FIG. 1, described in greater detail below, a layered stack 100 includes a substrate layer 110, a structural layer 120, and an infiltrating layer 130 juxtapositioned on the structural layer 120. The structural layer 120 in a layered stack 100 before infiltration includes voids 125 and a support material 128. The structural layer 120 in the layered stack 100 after infiltration includes voids 125, the support material 128 and the reinforcing component 138.

Figure 2:
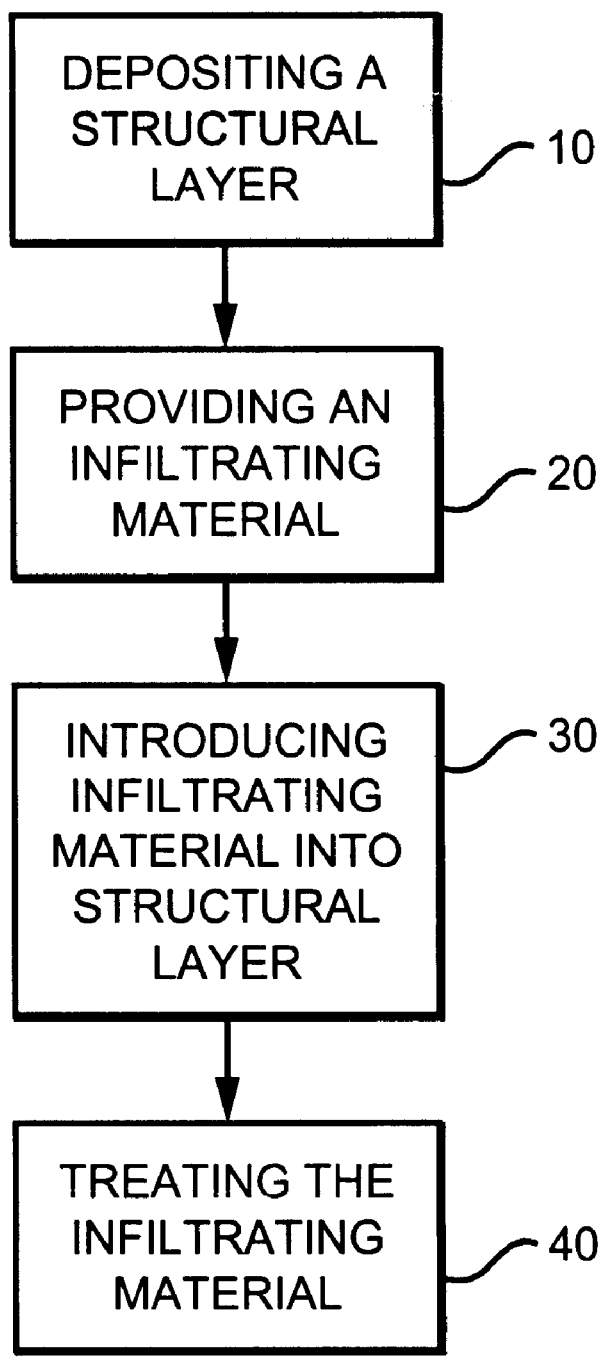
FIG. 2 shows a flowchart of a preferred method for producing infiltrated nanoporous materials.

In FIG. 2, described in greater detail below, a preferred method of producing infiltrated nanoporous materials comprises depositing a structural layer 10; providing an infiltrating material with a volatile component and a reinforcing component 20; introducing infiltrating material into the structural layer 30; and treating the infiltrating material 40.

As used herein, the term "structural layer" refers to a suitable low dielectric material (i.e. <3.0). The support material 128 of the structural layer 120, as shown in FIG. 1, can be composed of organic, inorganic or organometallic compounds depending on the desired consistency and mechanical properties of the structural layer 120 and the layered stack 100. Examples of contemplated organic compounds are polyethers, polyimides, thermoset aromatics or polyesters. Examples of contemplated inorganic compounds include silica or aluminosilicates as well as ceramic materials. Examples of contemplated organometallic compounds include poly(dimethylsiloxane), poly(vinylsiloxane) and poly(trifluoropropylsiloxane). The support material 128 may also include both polymers and monomers. It is further contemplated that the support material 128 may be composed of amorphous, cross-linked, crystalline, or branched polymers. Preferred components of the support material 128 are organic polymers. More preferred components of the support material 128 are organic, cross-linked polymers.

As used herein, the term "crosslinking" refers to a process in which at least two molecules, or two portions of a long molecule, are joined together by a chemical interaction. Such interactions may occur in many different ways including formation of a covalent bond, formation of hydrogen bonds, hydrophobic, hydrophilic, ionic or electrostatic interaction. Furthermore, molecular interaction may also be characterized by an at least temporary physical connection between a molecule with itself or between two or more molecules.

As used herein, the phrase "dielectric constant" means a dielectric constant of 1 MHz to 2 GHz, unless otherwise inconsistent with context. It is contemplated that the value of the dielectric constant of structural layer 120 is less than 3.0. In a preferred embodiment, the value of the dielectric constant is less than 2.5. In a more preferred embodiment, the value of the dielectric constant is less than 2.0.

As used herein, the word "void" means a volume in which mass is replaced with a gas. The composition of the gas is generally not critical, and appropriate gases include relatively pure gases and mixtures thereof, including air. It is contemplated that the structural layer 120 may comprise a plurality of voids 125. Voids 125 may have any suitable shape. Voids 125 are typically spherical, but may alternatively or additionally have tubular, lamellar, discoidal, or other shapes. It is also contemplated that voids 125 may have any appropriate diameter. It is further contemplated that voids 125 have some connections with adjacent voids 125 to create a structure with a significant amount of connected or "open" porosity. In preferred embodiments, voids 125 have a mean diameter of less than 1 micrometer. In more preferred embodiments, voids 125 have a mean diameter of less than 100 nanometers. And in still more preferred embodiments, voids 125 have a mean diameter of less than 10 nanometers. It is further contemplated that voids 125 may be uniformly or randomly dispersed within the structural layer 120. In a preferred embodiment, voids 125 are uniformly dispersed within the structural layer 120.

It is contemplated that the structural layer 120 can be deposited onto a substrate layer 110 by any suitable method. Contemplated methods include spinning the structural layer 120 onto the substrate layer 110, rolling the structural layer 120 onto the substrate layer 110, dripping the structural layer 120 onto the substrate layer 110, or pouring the structural layer 120 onto the substrate layer 110. In a preferred embodiment, the structural layer 120 is rolled or spun onto the substrate layer 110. It is contemplated that the structural layer 120 can be deposited in any suitably sized or shaped deposit. Especially contemplated depositions are thin-film type deposits (<1 mm); however, other depositions including thick-film (≧1 mm), or stand-alone deposits are also contemplated.

It is contemplated that the substrate layer 110 may comprise any desirable substantially solid material. Particularly desirable substrate layers would comprise films, glass, plastic, coated metal, or composite material. In preferred embodiments, the substrate layer 110 comprises a silicon wafer or germanium arsenide. In more preferred embodiments, the substrate layer 110 comprises a silicon wafer.

The structural materials described herein are similar in some respects to that which is described in U.S. Pat. No. 5,874,516 to Burgoyne et al. (Febuary 1999), incorporated herein by reference, and may be used in substantially the same manner as set forth in that patent. For example, it is contemplated that structural materials described herein may be employed in fabricating integrated circuits comprising components such as electronic chips, chips, and multichip modules, interlayer dielectrics, protective coatings, and substrate layers. Moreover, films or coatings of the structural materials described herein can be formed by solution techniques such as spraying, spin coating or casting, with spin coating being preferred. Preferred solvents are 2-ethoxyethyl ether, cyclohexanone, cyclopentanone, toluene, xylene, chlorobenzene, N-methyl pyrrolidinone, N,N-dimethylformamide, N,N-dimethylacetamide, methyl isobutyl ketone, 2-methoxyethyl ether, 5-methyl-2-hexanone, γ-butyrolactone, and mixtures thereof Typically, the coating thickness is between about 0.1 to about 15 microns. As a dielectric interlayer, the film thickness is less than 2 microns. Additives can also be used to enhance or impart particular target properties, as is conventionally known in the polymer art, including stabilizers, flame retardants, pigments, plasticizers, surfactants, and the like. Compatible or non-compatible polymers can be blended in to give a desired property. Adhesion promoters can also be used. Such promoters are typified by hexamethyidisilazane, which can be used to interact with available hydroxyl functionality that may be present on a surface, such as silicon dioxide, that was exposed to moisture or humidity. Polymers for microelectronic applications desirably contain low levels (generally less than 1 ppm, preferably less than 10 ppb) of ionic impurities, particularly for dielectric interlayers.

It is contemplated that the infiltrating material 132 may comprise a volatile component 136 and a reinforcing component 138. The volatile component 136 may comprise any suitable pure or mixture of organic, organometallic or inorganic molecules that are volatilized at a desired temperature. The volatile component 136 may also comprise any suitable pure or mixture of polar and non-polar compounds. In preferred embodiments, the volatile component 136 comprises water, ethanol, propanol, acetone, ethylene oxide, benzene, toluene, ethers, cyclohexanone and anisole. In more preferred embodiments, the volatile component 136 comprises anisole, toluene, cyclohexanone, ethers and acetone. In even more preferred embodiments, the volatile component 136 comprises cyclohexanone and anisole. As used herein, the term "pure" means that component that has a constant composition. For example, pure water is composed solely of $H_2O$. As used herein, the term "mixture" means that component that is not pure, including salt water. As used herein, the term "polar" means that characteristic of a molecule or compound that creates an unequal charge distribution at one point of or along the molecule or compound. As used herein, the term "non-polar" means that characteristic of a molecule or compound that creates an equal charge distribution at one point of or along the molecule or compound.

It is contemplated that the volatile component 136 may comprise any appropriate percentage of the infiltrating material 132 that would provide a desirable viscosity of the reinforcing component 138 and the volatile component 136, and also provide a means of controlling the amount of the reinforcing component 138 to be incorporated in the structural layer 120. In preferred embodiments, the volatile component 136 comprises that part of the infiltrating material 132 that is slightly more than is necessary to solvate the reinforcing component 138. In more preferred embodiments, the volatile component 136 comprises that part of the infiltrating material 132 that is necessary to solvate the reinforcing component 138. It is contemplated that the volatile component 136 comprises more than 80 wt. % of the infiltrating material 132. It is further contemplated that the volatile component 136 comprises more than 90 wt. % of the infiltrating material 132.

The reinforcing component 138 may comprise any suitable organic, organometallic or inorganic molecule, any of which may or may not comprise a polymer. Examples of contemplated organic polymers are polyimides, polyethers, polyesters, or polybenzils. Examples of contemplated organometallic polymers are various substituted polysiloxanes. Examples of contemplated inorganic polymers include silicate or aluminate. Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, super-branched, or three-dimensional. The molecular weight of contemplated polymers spans a wide range, typically between 400 Dalton and 400,000 Dalton or more. In a preferred embodiment, the reinforcing component 138 comprises organic molecules or polymers. In a most preferred embodiment, the reinforcing component 138 comprises a high temperature stable polymer, including poly(arylene ether), phenolic resins, polyimides, and thermoset aromatics.

It is further contemplated that the reinforcing component 138 may additionally or alternately comprise monomers. As used herein, the term "monomer" refers to any chemical compound that is capable of forming a covalent bond with itself or a chemically different compound in a repetitive manner. The repetitive bond formation between monomers may lead to a linear, branched, superbranched, or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. Examples of contemplated organic monomers are acrylamide, vinylchloride, fluorene bisphenol or 3,3'-dihydroxytolane. Examples of contemplated organometallic monomers are octamethylcyclotetrasiloxane, methylphenylcyclotetrasiloxane, hexanethyldisilazane, and triethyoxysilane. Examples of contemplated inorganic monomers include tetraethoxysilane or aluminum isopropoxide. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

In further alternative embodiments, many silicon-containing materials other than colloidal silica are contemplated as components of the reinforcing component 138, including fumed silica, siloxanes, silsequioxanes, and sol-gel-derived monosize silica. Appropriate silicon-containing compounds preferably have a size of below 100 nm, more preferably below 10 nm and most preferably below 5 nm. It is also contemplated that the reinforcing component 138 may comprise materials other than silicon-containing materials, including organic, organometallic or partially-inorganic materials, provided that such materials can be dissolved at least in part in a solvent that does not dissolve the support material 128. For example, appropriate organic materials are polystyrene, and polyvinyl chloride. Contemplated organometallic materials are, for example, octamethylcyclotetrasiloxane. Contemplated inorganic materials are, for example, $KNO^3$.

It is contemplated that the infiltrating material 132 can be introduced into at least some of the plurality of voids 125 found in the structural layer 120 by any suitable method. It is contemplated that suitable methods of introducing the infiltrating material 132 onto the structural layer 120 include spinning the infiltrating material 132 onto the structural layer 120, rolling the infiltrating material 132 onto the structural layer 120, and dripping or pouring the infiltrating material 132 onto the structural layer 120. It is also contemplated that suitable methods of introducing the infiltrating material 132 into some of voids 125 include gravity precipitation, applying force or pressure to the structural layer 120, or shaking or otherwise moving the structural layer 120. In a preferred embodiment, the infiltrating material 132 is introduced onto the structural layer 120 by dripping, spin coating or pouring, and the infiltrating material 132 is introduced into some of voids 125 by gravity precipitation.

Any excess of the infiltrating material 132 can then be optionally, partially, or completely removed from the structural layer 120 by any suitable removal apparatus or methods. It is contemplated that removal can include spinning off excess infiltrating material 132, or rinsing off excess infiltrating material 132 with an appropriate solvent. Suitable solvents may include cyclohexanone, anisole, toluene, ether or mixtures of compatible solvents. It is further contemplated that there may be no excess infiltrating material 132, and thus, there will be no need for an infiltrating material removal step. It is even further contemplated that the infiltrating material 132 may itself be used to rinse the top surface of the structural layer 120. It is also contemplated that the ration of the volatile component 136 to the reinforcing component 138 may be increased in the rinse material. As used herein, the phrase "any excess" does not suggest or imply that there is necessarily any excess infiltrating material 132.

It is contemplated that the volatile component 136 can be removed from the infiltrating material 132 by any suitable removal procedure, including heat and/or pressure to form an infiltrating layer 130 that can coat the surface of the structural layer 120 or coat both the surface of the structural layer 120 and the surfaces of the voids 125 in the structural layer 120. In preferred embodiments, the volatile component 136 can be removed by heating the infiltrating material 132 or the layered stack 100. In more preferred embodiments, the volatile component 136 is removed by heating the infiltrating material 132 or the layered stack 100 in a gaseous environment at atmospheric pressure. In other preferred embodiments, the volatile component 136 is removed by heating the infiltrating material 132 or the layered stack in a gaseous environment at sub-atmospheric pressure. As used herein, the phrase "sub-atmospheric pressure" means that pressure that has a value lower than one atmosphere. As used herein, the phrase "atmospheric pressure" means that pressure that has a value of 760 atmospheres. As used herein, the phrase "gaseous environment" means that environment that contains pure gases, including nitrogen, helium, or argon; or mixed gases, including air.

It is contemplated that the layered stack 100 can be cured to its final form before or after any excess the infiltrating material 132 is removed from the layered stack 100. Although in preferred embodiments the layered stack 100 is cured using heat, many other methods are contemplated, including catalyzed and uncatalyzed methods. Catalyzed methods may include general acid- and base catalysis, radical catalysis, cationic- and anionic catalysis, and photo-catalysis. For example, a polymeric structure may be formed by UV-irradiation, addition of radical starters, such as ammoniumpersulfate, and addition of acid or base. Uncatalyzed methods include application of pressure, or application of heat at subatmospheric, atmospheric or super-atmospheric pressure.

It is contemplated that the mechanical strength of the original and final structural layer can be determined by tensile testing that measures Young's modulus, yield strength, and ultimate tensile strength. It is also contemplated that the structural strength of the original and final structural layer can be determined by nanoindentation techniques. It is further contemplated that the mechanical strength can be determined by stud pull techniques. As used herein, the phrase "stud pull techniques" means those techniques that are used to determine the pull strength, or force, needed to rupture the structural layer 120. In preferred embodiments, a stud pull test is performed using a Sebastian Five stud pull tester manufactured by Quad group.

It is contemplated that the mechanical strength of the final layered stack 100 will be increased substantially from the original mechanical strength of the initial structural layer 120. As used herein, the phrase "increased substantially" means an increase in the original mechanical strength of the structural layer 120 of at least 10%. In preferred embodiments, the mechanical strength of the final layered stack 100 will be increased by at least 100%. In more preferred embodiments, the mechanical strength of the final layered stack 100 will be increased by at least 300%.

EXAMPLES

Example 1

A spinning solution containing 5 wt % polyarylene ether, 5 wt % colloidal silica, 15 wt % MIBK (methylisobutylketone) and 75 wt % cyclohexanone can be used to form a low dielectric structural layer on a silicon wafer that is approximately 8000 Angstroms in thickness and in the form of a film. The film can then be baked at 150/200/250° C. for 1 minute each and cured at 400° C. for 60 minutes in nitrogen. The post-cure film can be etched with BOE 50:1 solution for 13 minutes to remove the silica. After etching, >98% of the silica is removed, and the post-etch film is a porous polyarylene ether. The refractive index of the post-etch film is about 1.474 with a thickness of approximately 7034 Angstroms. The dielectric constant of the structural layer is about 2.06. A stud pull test was conducted using a Sebastian Five stud pull tester manufactured by Quad group. The cured, coated wafer is first processed to deposit a dense, 1-micron thick layer of aluminum on the surface of the structural material. The layered stack was cut into multiple pieces of about a 1 cm×1 cm each. A ceramic backing plate with epoxy coating was attached to the non-infiltrated side of the test pieces. Studs, which are metal pins with epoxy coating on the tip of the pin, were attached to the film of the test piece. The backing plate, test piece and the stud were then clipped together by a metal clip. This procedure is called the stud assembly. The assembled pieces were cured in an oven at 130° C. for 2 hours. After curing the epoxy, the stud, test piece and backing plate were glued together. The end of the stud was then inserted into the Quad group, Sebastian Five, stud pull tester. Pulling force was applied to the stub until the assembled piece broke. Maximum strength achieved, in Kpsi, recorded during the test was taken as the stud pull strength of the film for that piece. Typically, at least ten pieces from a specimen are tested. The stud pull strength reported is the mean value of the measurements. The stud pull test showed a strength of 10.5 Kpsi. The stud pull strength is about 0.67 Kpsi. About 2 mL of 4 wt % polyarylene ether solution in cyclohexanone is dispensed onto the post-etch film described above. Once the polyarylene ether solution has rested on top of the film for 15 seconds, the layered stack is spun at approximately 2000 RPM. After the spinning step, about 9 mL of cyclohexanone is dispensed onto the film and then a second spin at 2000 RPM is used to rinse off the excess resin in a spin coater operation. The infiltrated and rinsed layered stack is then baked on hot plates at 150/200/250° C. for one minute each to remove the cyclohexanone, thus forming the final infiltrated low dielectric structural layer. This infiltrated material is then cured at 400° C. for 60 minutes. Tests following the formation of the infiltrated layer showed that the material has a uniform distribution of 12–16 nm pores without the existence of the >20 nm big pores. The dielectric constant of the infiltrated layer was 2.12 with a refractive index of 1.494 and a film thickness of 6800 Angstroms. Scanning Electron Microscopy (SEM) showed that there was no infiltrating layer on top of the structural layer.

Example 2

A spinning solution precursor was made from the addition of 18 g of polyethylene oxide to 100 g of a composition comprising 14.7 wt % siloxane resin, 32 wt % ethanol, 30 wt % 2-propanol, 14 wt % acetone, and 10 wt % water. The mixture was heated to about 60° C. to dissolve the polyethylene oxide, resulting in a homogenous solution. A mixed solvent weighing 86 g and comprising 35 wt % 2-propanol, 35 wt % ethanol, 20 wt % acetone, and 10 wt % water was added to the 118 g of spinning solution precursor. The resulting solution is the spinning solution. The spinning solution, or spin-on solution, was dispensed onto the silicon wafer at a spin speed of 5000 rpm. The resulting film was then baked to 150° C., 200° C. and 250° C. for one minute each. Polyethylene oxide was completely removed in the bake process, leaving behind only the porous siloxane matrix. FTIR confirms the absence of polyethylene oxide in the post bake film. The dielectric constant of the structural layer is about 2.0, and the stud pull strength is about 0.6 Kpsi. A 4 wt % polyarylene ether solution in cyclohexanone was used to infiltrate the porous siloxane film. 2 ml of the 4 wt % polyarylene ether solution was dispensed onto the porous film, followed by 5 seconds of spread at 500 RPM, 30–60 seconds sitting at 0 rpm for 30 seconds of infiltration, and 60 seconds of spinning at 2000 RPM. The resulting film was then baked to 150° C., 200° C. and 250° C. for one minute each and cured at 400° C. for 1 hour in flowing nitrogen. The film thickness was measured by scanning electron microscopy (SEM). The infiltrated samples showed an additional layer on top of the porous structures. This top layer is solid polyarylene ether as confirmed from the refractive index of 1.67. A stud pull test gave a film strength of 8 Kpsi. Thickness of the top layer was about 300 A. Infiltration of the porous film showed at least 10-fold increase in stud pull strength while keeping the dielectric constant in the 2.0 level.

Example 3

100 grams of solution containing 6 wt. % polymethylsiloxane, 49 wt. % isopropyl alcohol, 40 wt. % acetone and 5 wt. % water is mixed with 6 grams of polyethylene oxide. The solution is heated to about 60° C. to dissolve the polyethylene oxide in the solution. The solution is spun onto a silicon wafer at a spin speed of 4000 RPM. After spinning, the wafer is baked to 80° C., 150° C., and 250° C. for one minute each. The bake film is then cured at 400° C. in flowing nitrogen for 30 minutes. A porous low dielectric polymethylsiloxane film is formed.

Five mL of 6 wt. % polycarbosilane $(SiH_2CH_2)_n$ in cyclohexanone is dispensed onto the porous polymethylsiloxane film, followed by 10 seconds spread at 100 RPM, 90 seconds at 0 RPM and 30 seconds at 3000 RPM. The infiltrated film is then baked at 80° C., 150° C., and 250° C. for one minute each, followed by curing at 400° C. for 30 minutes in nitrogen. The dielectric constant of the film is 2.2 and the stud pull strength is 7 Kpsi.

Example 4

100 grams of solution containing 10 wt. % polyhydridosilsequioxane $(HSiO_{3/2})^n$ and 90 wt. % methyl isobutyl ketone is placed in a beaker. 5 grams of polypropylene oxide in 50 grams of methyl ether ketone is prepared. The spin-on solution is made by mixing the above two solutions together. The solution is spun onto a silicon wafer at a spin speed of 4000 RPM. After spinning, wafer is then baked at 80° C., 150° C., and 250° C. for one minute each, followed by curing at 400° C. for 60 minutes in nitrogen. A porous low dielectric polyhydridosilsesquioxane film is formed.

Six mL of 8 wt. % polyhydridomethylsiloxane $(HCH_3SiO)_n$ in dibutyl ether is dispensed onto the porous film, followed by 3 seconds spread at 150 RPM, 50 seconds at 0 RPM, and 60 seconds at 2000 RPM. The infiltrated film is then baked at 80° C., 150° C., and 250° C. for one minute each, followed by curing at 400° C. for 30 minutes in nitrogen. Dielectric constant of the film is 2.3 and the stud pull strength is 8 Kpsi.

Thus, specific embodiments and applications of infiltrated nanoporous materials have been disclosed. It should be apparent, however, to those skilled in the art that many more modifications besides those already described are possible without departing from the inventive concepts herein.

The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A low dielectric constant structural layer having increased mechanical strength and having a plurality of voids comprising:
    a substrate layer;
    a low dielectric structural layer that substantially comprises a polymer and that juxtaposes the substrate layer; and
    an infiltrating layer comprising an infiltrating material having a volatile component and a reinforcing component juxtaposing the structural layer and coating at least some of the plurality of voids.

2. The polymer of claim 1, wherein the polymer comprises poly(arylene ether).

3. The structural layer of claim 1, wherein the voids have a mean diameter of less than 1 micrometer.

4. The structural layer of claim 1, wherein the voids have a mean diameter of less than 100 nanometers.

5. The structural layer of claim 1, wherein the substrate layer is a silicon wafer.

6. The structural layer of claim 1, wherein the reinforcing component substantially comprises a polymer.

7. The polymer of claim 6, wherein the polymer comprises poly(arylene ether).

8. The poly(arylene ether) of claim 7, wherein the poly(arylene ether) is cross-linked.

9. The polymer of claim 6, wherein the polymer comprises polycarbosilane.

10. The structural layer of claim 1, wherein the volatile component is cyclohexanone.

* * * * *